(12) United States Patent
Li et al.

(10) Patent No.: US 8,532,248 B2
(45) Date of Patent: Sep. 10, 2013

(54) SHIFT REGISTER UNIT CIRCUIT, SHIFT REGISTER, ARRAY SUBSTRATE AND LIQUID CRYSTAL DISPLAY

(75) Inventors: Tianma Li, Beijing (CN); Xiaojing Qi, Beijing (CN)

(73) Assignees: Boe Technology Group Co., Ltd., Beijing (CN); Chengdu Boe Optoelectronics Technology Co., Ltd., Chengdu, Sichuan Province (CN)

( * ) Notice: Subject to any disclaimer, the term of this patent is extended or adjusted under 35 U.S.C. 154(b) by 0 days.

(21) Appl. No.: 13/472,719

(22) Filed: May 16, 2012

(65) Prior Publication Data

US 2012/0293737 A1 Nov. 22, 2012

(30) Foreign Application Priority Data

May 16, 2011 (CN) .......................... 2011 1 0126328

(51) Int. Cl.
*G11C 19/00* (2006.01)
(52) U.S. Cl.
USPC ..................... 377/64; 377/68; 377/78; 377/79

(58) Field of Classification Search
USPC .................... 377/64, 68, 69, 78, 79
See application file for complete search history.

(56) References Cited

U.S. PATENT DOCUMENTS

| | | | | |
|---|---|---|---|---|
| 7,844,026 | B2 * | 11/2010 | Chiang et al. ................... | 377/64 |
| 7,873,140 | B2 * | 1/2011 | Moon et al. ..................... | 377/76 |
| 7,983,379 | B2 * | 7/2011 | Ieong et al. ..................... | 377/64 |
| 8,027,426 | B1 * | 9/2011 | Yang et al. ...................... | 377/64 |

* cited by examiner

*Primary Examiner* — Hai L Nguyen
(74) *Attorney, Agent, or Firm* — Ladas & Parry LLP (57) ABSTRACT

Embodiments of the disclosed technical solution provides a shift register unit circuit which operates based on two clock signals and comprises input terminals, a pre-charging circuit, a level pulling-down circuit, a outputting circuit and a scan signal output terminal. Embodiments of the disclosed technical solution also provides a shift register having at least two shift register unit circuits connected in cascade, and further provides a liquid crystal display array substrate and a liquid crystal display. The disclosed technical solution stabilizes the wave output from the scan signal output terminal and has small noise by means of a design of pulling down the level, and may realize the GOA circuit utilizing less TFTs circuits, so that the circuit structure is simple and power consumption is small.

20 Claims, 6 Drawing Sheets

SHIFT REGISTER UNIT CIRCUIT, SHIFT REGISTER, ARRAY SUBSTRATE AND LIQUID CRYSTAL DISPLAY

BACKGROUND

A disclosed technical solution relates to a shift register unit circuit, a shift register, an array substrate and a liquid crystal display.

Figure 1:
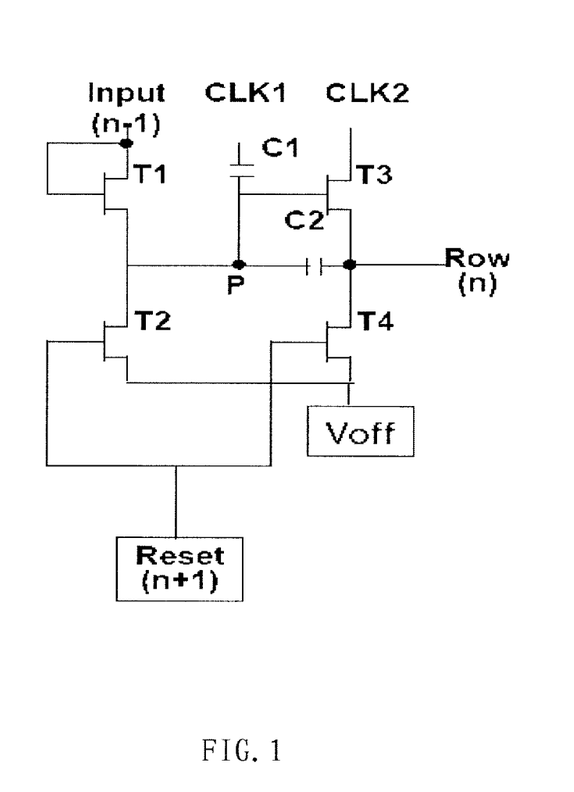
FIG. 1 is a basic principle diagram of a shift register unit circuit in a GOA circuit.

The liquid crystal display is a plane display which employs glass substrate as the substrate, and forms color film structure or TFT circuit structure on the glass substrate. In order not to increase any process and manufacture cost, a manufacture process for forming TFTs (Thin Film Transistor) in a pixel circuit is employed to manufacture a driving circuit to make the pixel circuit and the driving circuit on a same substrate only by designing a GOA (Gate driver IC On Array) circuit (for example, a principle view of the shift register unit circuit in the GOA circuit as shown in FIG. 1). In this case, a best scenario is to use transistors such as TFTs to form the driving circuit including the shift register so as to reduce the manufacture costs. However, in prior art, the shift register unit circuit formed by the transistors has a disadvantage of high power consumption due to too many TFTs used in the circuit; further, there are problems that a gate driving output of the shift register is not stable and has many burrs.

SUMMARY

For the above problems, the disclosed technical solution provides a shift register unit circuit, shift register, array substrate and liquid crystal display which may have low power consumption and output a stable gate scan signal.

According to an embodiment, the shift register unit circuit comprises:

input terminals including a start signal input terminal, a first clock signal input terminal and a second clock signal input terminal;

a pre-charging circuit for outputting a turn-on level in response to an enable level of a start signal and of a first clock signal, and keeping the turn-on level being output during one clock period of the first clock signal;

a level pulling-down circuit for pulling down a level at an output terminal of the pre-charging circuit and outputting a low level in response to the enable level of the second clock signal, and for output a high level in response to a disable level of the second clock signal, after the turn-on level is input; and for outputting the high level after the turn-on level is turned off;

an outputting circuit, which is coupled to the output terminal of the level pulling-down circuit, for pulling down a level at an output terminal of the outputting circuit and outputting the low level in response to the high level output from the level pulling-down circuit, and for outputting the high level in response to the low level output from the level pulling-down circuit; and a scan signal output terminal, which is coupled to the output terminal of the outputting circuit, for outputting a scan signal.

The level pulling-down circuit comprises a first level pulling-down circuit and a second level pulling-down circuit, wherein:

the first level pulling-down circuit pulls down the level at the output terminal of the pre-charging circuit and outputs the pulled-down low level, after the turn-on level is input; and outputs the high level after the turn-on level is turned off;

the second level pulling-down circuit outputs the low level in response to the enable level of the second clock signal, and outputs the high level in response to the disable level of the second clock signal, when the first level pulling-down circuit outputs the pulled-down low level; and the second level pulling-down circuit outputs the high level when the first level pulling-down circuit outputs the high level.

Furthermore, the shift register unit circuit may comprises a feedback circuit for feeding the scan signal output via the output terminal back to the output terminal of the level pulling-down circuit so as to stabilize the output scan signal.

In a detail implementation, the pre-charging circuit comprises a first switch, a first node and a capacitor, wherein:

a gate of the first switch is connected to the first clock signal, a drain thereof is connected to the start signal, and a source thereof is coupled to the first node;

the first node is a turn-on level output terminal of the pre-charging circuit; and one terminal of the capacitor is coupled to the first node, and the other terminal is coupled to the low level.

In a detailed implementation, the first level pulling-down circuit comprises a second switch, a second node and a third switch, wherein:

a gate and a drain of the second switch are coupled to each other, the drain thereof is connected to the high level, and a source thereof is coupled to the second node;

the second node is the output terminal of the first level pulling-down circuit;

a gate of the third switch is connected to the turn-on level output terminal of the pre-charging circuit, a drain thereof is coupled to the second node, and a source thereof is connected to the low level.

In a detailed implementation, the second level pulling-down circuit comprises a fourth switch, a third node and a fifth switch, wherein:

a gate of the fourth switch is connected to the second clock signal, a drain thereof is coupled to the output terminal of the first level pulling-down circuit, and a source thereof is coupled to the third node;

the third node is the output terminal of the second level pulling-down circuit;

a gate and a drain of the fifth switch are coupled to each other, the drain thereof is connected to the high level, and a source thereof is coupled to the third node.

In a detailed implementation, the outputting circuit comprises a sixth switch and a seventh switch, wherein:

a gate and a drain of the sixth switch are coupled to each other, the drain thereof is connected to the high level, and a source thereof is coupled to the scan signal output terminal;

a gate of the seventh switch is coupled to the output terminal of the second level pulling-down circuit, a drain thereof is coupled to the scan signal output terminal, and a source thereof is connected to the low level.

In a detailed implementation, the feedback circuit comprises a eighth switch, a fourth node and a ninth switch, wherein:

a gate and a drain of the eighth switch are coupled to each other, the drain thereof is connected to the high level, and a source thereof is coupled to the fourth node;

the fourth node is a feedback output terminal of the feedback circuit and is coupled to the output terminal of the level pulling-down circuit;

a gate of the ninth switch is coupled to the scan signal output terminal, a drain thereof is coupled to the fourth node, and a source thereof is connected to the low level.

According to an embodiment, the shift register includes at least two shift register unit circuits connected in cascade, wherein each of the shift register unit circuit operates based on two clock signals and is any one of the above-described shift register unit circuit.

According to an embodiment, there is provided a liquid crystal display array substrate on which a GOA circuit is disposed, and the shift register in the GOA circuit is the above-described shift register.

According to an embodiment, there is provided a liquid crystal display, which comprises a liquid crystal display array substrate as described above.

The disclosed technical solutions have advantageous effects as follows.

a) Less TFTs (thin film transistor) are used in the shift register unit circuit to realize the GOA circuit, therefore the circuit structure is simple and power consumption is reduced clearly.

b) A design of pulling down the level is utilized, so that the gate scan signal output from the shift register is stable and has small noise.

c) The signal output from the shift register is further stabilized and has smaller noise by adding one feedback circuit.

d) The shift register is suitable for the requirements of GOA circuit including TFTs which utilize LTPS (Low Temperature Poly-silicon) as an active layer, and is also suitable for the GOA circuit including TFTs which utilize amorphous silicon (a-Si) as the active layer.

DETAILED DESCRIPTION

Below detailed implementations of the disclosed technical solution will be described in further details in connection with the accompanying drawings.

Figure 2:
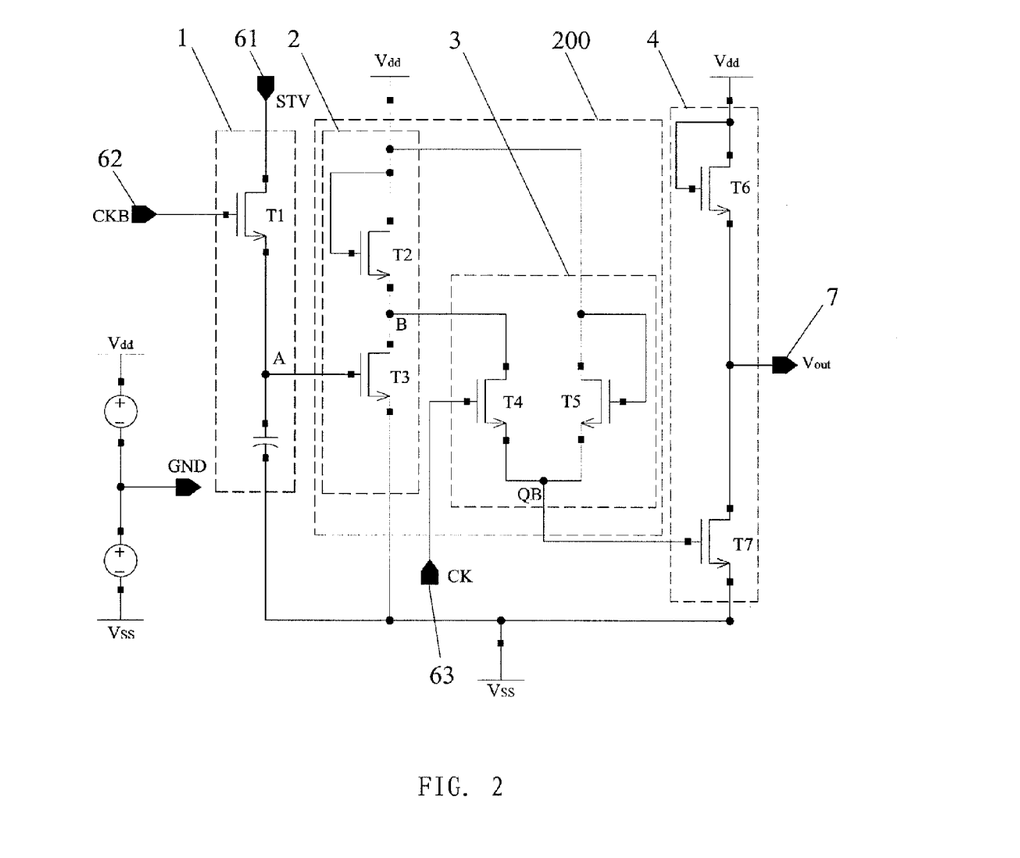
FIG. 2 is a schematic view of the shift register unit circuit according to an Embodiment 1 of the disclosed technical solution.

FIG. 2 illustrates a principle view of a shift register unit circuit according to one embodiment of the disclosed technical solution. The shift register unit circuit comprises: input terminals, a pre-charging circuit 1, a level pulling-down circuit 200, an outputting circuit 4 and a scan signal output terminal 7, wherein:

the input terminals includes a start signal input terminal 61, a first clock signal input terminal 62 and a second clock signal input terminal 63;

the pre-charging circuit 1 outputs a turn-on level in response to an enable level of a start signal and of a first clock signal, and keeps the turn-on level being output during one clock period of the first clock signal;

the level pulling-down circuit 200 pulls down a level at an output terminal of the pre-charging circuit and outputs a low level in response to the enable level of the second clock signal, and outputs a high level in response to a disable level of the second clock signal, after the turn-on level is input; and outputs the high level after the turn-on level is turned off;

the outputting circuit 4 which is coupled to the output terminal of the level pulling-down circuit 200, pulls down a level at an output terminal of the outputting circuit 4 and outputs the low level in response to the high level output from the level pulling-down circuit 200, and outputs the high level in response to the low level output from the level pulling-down circuit 200; and the scan signal output terminal 7 is coupled to the output terminal of the outputting circuit 4, and outputs a scan signal.

As a further embodiment of the disclosed technical solution, in order to make the scan signal output from the shift register unit circuit stable and having less burrs, the level pulling-down circuit 200 comprises a first level pulling-down circuit 2 and a second level pulling-down circuit 3, wherein:

the first level pulling-down circuit 2 pulls down the level at the output terminal of the pre-charging circuit 1 and outputs the pulled-down low level from the output terminal (a node B as shown in the FIG. 2) of the first level pulling-down circuit 2 after the turn-on level is input; and outputs the high level after the turn-on level is turned off;

the second level pulling-down circuit 3 outputs the low level from the output terminal (a node QB as shown in the FIG. 2) of the second level pulling-down circuit 3 in response to the enable level of the second clock signal, and outputs the high level in response to the disable level of the second clock signal, when the first level pulling-down circuit 2 outputs the pulled-down low level; and the second level pulling-down circuit 3 outputs the high level from the output terminal thereof when the first level pulling-down circuit 2 outputs the high level.

Figure 3:
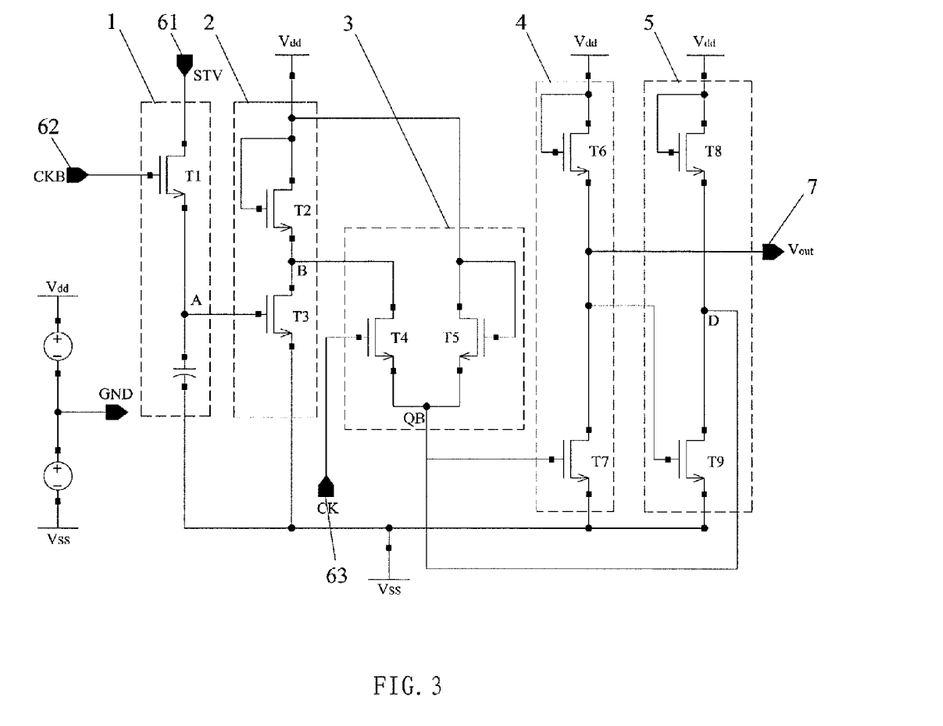
FIG. 3 is a schematic view of the shift register unit circuit according to an Embodiment 2 of the disclosed technical solution.

As a further embodiment of the disclosed technical solution, in order to make the scan signal output from the shift register unit circuit stable and having less burrs, the shift register unit circuit further comprises a feedback circuit 5 for feeding the scan signal output via the scan signal output terminal 7 back to the output terminal of the level pulling-down circuit 200 so as to stabilize the output scan signal, as shown in FIG. 3.

In the disclosed technical solution, the enable level is a high level, and the disable level is a low level.

Below the shift register unit circuit will be described in further details in connection with the detailed embodiments.

Embodiment 1

FIG. 2 illustrates a shift register unit circuit according to an embodiment of the disclosed technical solution, and all of switches T1-T7 in this embodiment are TFTs (Thin Film Transistor). As can be seen from the FIG. 2, the pre-charging circuit 1 comprises a first switch T1, a first node A and a capacitor C. A gate of the first switch T1 is connected to a first clock signal CKB, a drain thereof is connected to a start signal (the start signal may be a STV signal or a level signal output from the shift register unit circuit in the last stage), and a source thereof is coupled to the first node A; the first node A is a turn-on level output terminal of the pre-charging circuit 1; and one terminal of the capacitor C is coupled to the first node A, and the other terminal is coupled to a low level $V_{SS}$.

The first level pulling-down circuit 2 comprises a second switch T2, a second node B and a third switch T3. A gate and a drain of the second switch T2 are coupled to each other, the drain thereof is connected to a high level Vdd, and a source thereof is coupled to the second node B. The second node B is the level output terminal of the first level pulling-down circuit 2. A gate of the third switch T3 is connected to the turn-on level output terminal of the pre-charging circuit 1, a drain thereof is coupled to the second node B, and a source thereof is connected to the low level $V_{SS}$.

The second level pulling-down circuit 3 comprises a fourth switch T4, a third node QB and a fifth switch T5. A gate of the fourth switch T4 is connected to a second clock signal CK, a drain thereof is coupled to the level output terminal of the first level pulling-down circuit 2, and a source thereof is coupled to the third node QB. The third node QB is the output terminal of the second level pulling-down circuit 3. A gate and a drain of the fifth switch T5 are coupled to each other, the drain thereof is connected to the high level $V_{dd}$, and a source thereof is coupled to the third node QB.

The outputting circuit 4 comprises a sixth switch T6 and a seventh switch T7. A gate and a drain of the sixth switch T6 are coupled to each other, the drain thereof is connected to the high level $V_{dd}$, and a source thereof is coupled to the scan signal output terminal $V_{out}$. A gate of the seventh switch T7 is coupled to the output terminal of the second level pulling-down circuit 3, a drain thereof is coupled to the scan signal output terminal $V_{out}$, and a source thereof is connected to the low level $V_{SS}$.

Figure 4:
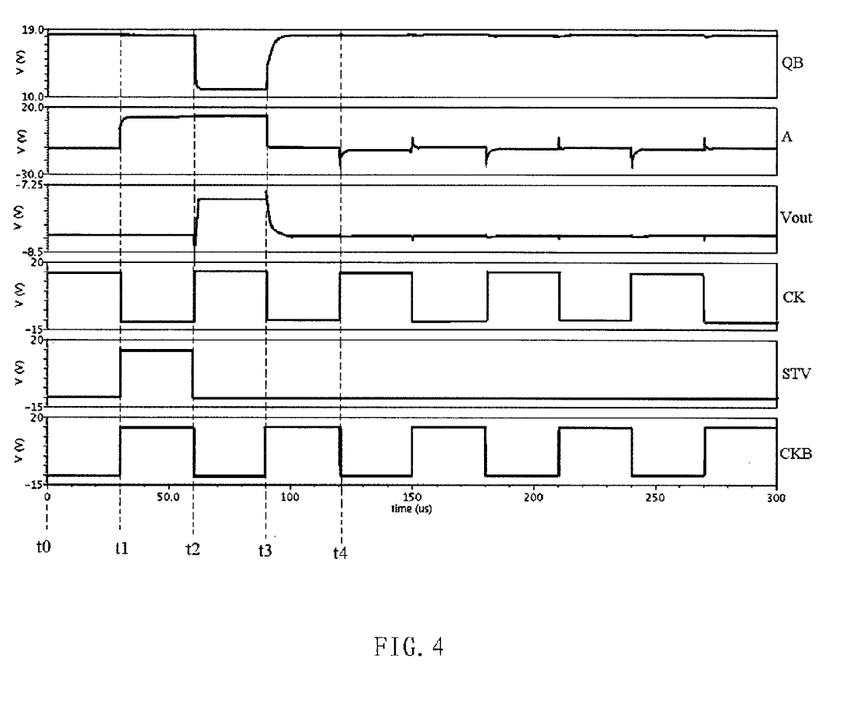
FIG. 4 is a timing diagram of the Embodiment 1 of the disclosed technical solution.

FIG. 4 illustrates an operating timing diagram of the embodiment. As shown in the figure, the above-described circuit is operated under the first clock signal CKB and the second clock signal CK which are input differentially. That is to say, the first clock signal CKB and the second clock signal CK are input differentially, therefore the second clock signal CK is at the low level when the first clock signal CKB is at the high level, while the second clock signal CK is at the high level when the first clock signal CKB is at the low level, and the first clock signal CKB and the second clock signal CK have a same clock period.

At time period t0~t1 in the FIG. 4, the first clock signal CKB outputs the low level, and the second clock signal CK outputs the high level. At this time, the first switch T1 is turned off, the start signal such as STV coupled to the first switch T1 outputs the low level, that is, the node A outputs the low level. When the node A outputs the low level, the third switch T3 is turned off and the node B outputs the high level. Then the fourth switch T4 is turned on, while the fifth switch T5 is also turned on, and the node QB outputs the high level. When the node QB outputs the high level, the seventh switch T7 is turned on and the scan signal output terminal $V_{out}$ outputs the low level.

At time period t1~t2 in the FIG. 4, the first clock signal CKB outputs the high level, and the second clock signal CK outputs the low level. At this time, the first switch T1 is turned on, the start signal (STV) outputs the high level, and therefore the node A outputs the high level and at the same time the capacitor C is charged. The third switch T3 is turned on and the node B outputs the low level, when the node A outputs the high level; the fourth switch T4 is turned off, the fifth switch T5 is turned on, and the node QB outputs the high level; when the node QB is at the high level, the seventh switch T7 is turned on and the scan signal output terminal $V_{out}$ outputs the low level.

At time period t2~t3 in the FIG. 4, the first clock signal CKB outputs the low level, and the second clock signal CK outputs the high level. At this time, the start signal outputs the low level and the charging of the capacitor C stops. The capacitor C starts to discharge, and the node A maintains to be at the high level until the discharging of the capacitor C is completed (that is, the time t3 in the figure). When the node A outputs the high level, the third switch T3 is turned on so that the high level output from the node A is pulled down for the first time and outputted, that is, the node B outputs the low level. At this time, the second clock signal CK outputs the high level so as to turn on the fourth switch T4, while the fifth switch T5 is turned on; since the voltage division on T5 is bigger than that on T4 by setting the width/length ratio of the channel of the T4 and T5, the node QB still outputs the low level; when the node QB is at the low level, the seventh switch T7 is turned off and the scan signal output terminal $V_{out}$ outputs the high level.

At time period t3~t4 in the FIG. 4, the first clock signal CKB outputs the high level, and the second clock signal CK outputs the low level. The switch T1 is turned on since the first clock signal CKB outputs the high level, but the start signal coupled to the drain of the first switch T1 outputs the low level and the discharging of the capacitor C is completed, therefore the node A outputs the low levels. When the node A is at the low level, the third switch T3 is turned off so that the node B outputs the high level. As the second clock signal CK outputs the low level, the fourth switch T4 is turned off. While the fifth switch T5 is turned on, the node QB outputs the high level, and the seventh switch T7 is turned on so that the scan signal output terminal $V_{out}$ outputs the low level.

After time t4, the scan signal output terminal $V_{out}$ would always outputs the low level as long as the start signal does not output the high level, regardless how the first clock signal CKB and the second clock signal CK change. When the start signal outputs the high level again, the above-described shift register unit circuit would repeat the operation timing from t0 again.

Embodiment 2

FIG. 3 illustrates a shift register unit circuit according to another embodiment of the disclosed technical solution. This embodiment adds a feedback circuit 5 on the basis of Embodiment 1, wherein the feedback circuit 5 feeds the scan signal output via the scan signal output terminal $V_{out}$ back to the output terminal (namely, at the node QB in the FIG. 3) of the second level pulling-down circuit 3, in order to stabilize the outputted scan signal. As shown in FIG. 3, the feedback circuit 5 comprises a eighth switch T8, a fourth node D and a ninth switch T9. Wherein a gate and a drain of the eighth switch T8 are coupled to each other, the drain thereof is connected to the high level $V_{dd}$, and a source thereof is coupled to the fourth node D. The fourth node D is a feedback output terminal of the feedback circuit 5 and is coupled to the output terminal of the second level pulling-down circuit 3. A gate of the ninth switch T9 is coupled to the scan signal output terminal, a drain thereof is coupled to the fourth node D, and a source thereof is connected to the low level $V_{SS}$.

Its operation principle is as follows. When $V_{out}$ outputs the high level, the ninth switch T9 is turned on, the fourth node D outputs the low level, and the low level output from the fourth node D is fed back to the node QB in FIG. 3, so that the low level output from the node QB is more stable and in turn the high level output from the scan signal output terminal $V_{out}$ is more stable. When $V_{out}$ outputs the low level, the ninth switch T9 is turned off, the fourth node D is at the high level, and the high level output from the fourth node D is fed back to the node QB in FIG. 3 so as to stabilize the high level output from the node QB, and in turn the low level output from the scan signal output terminal $V_{out}$ is more stable.

Figure 5:
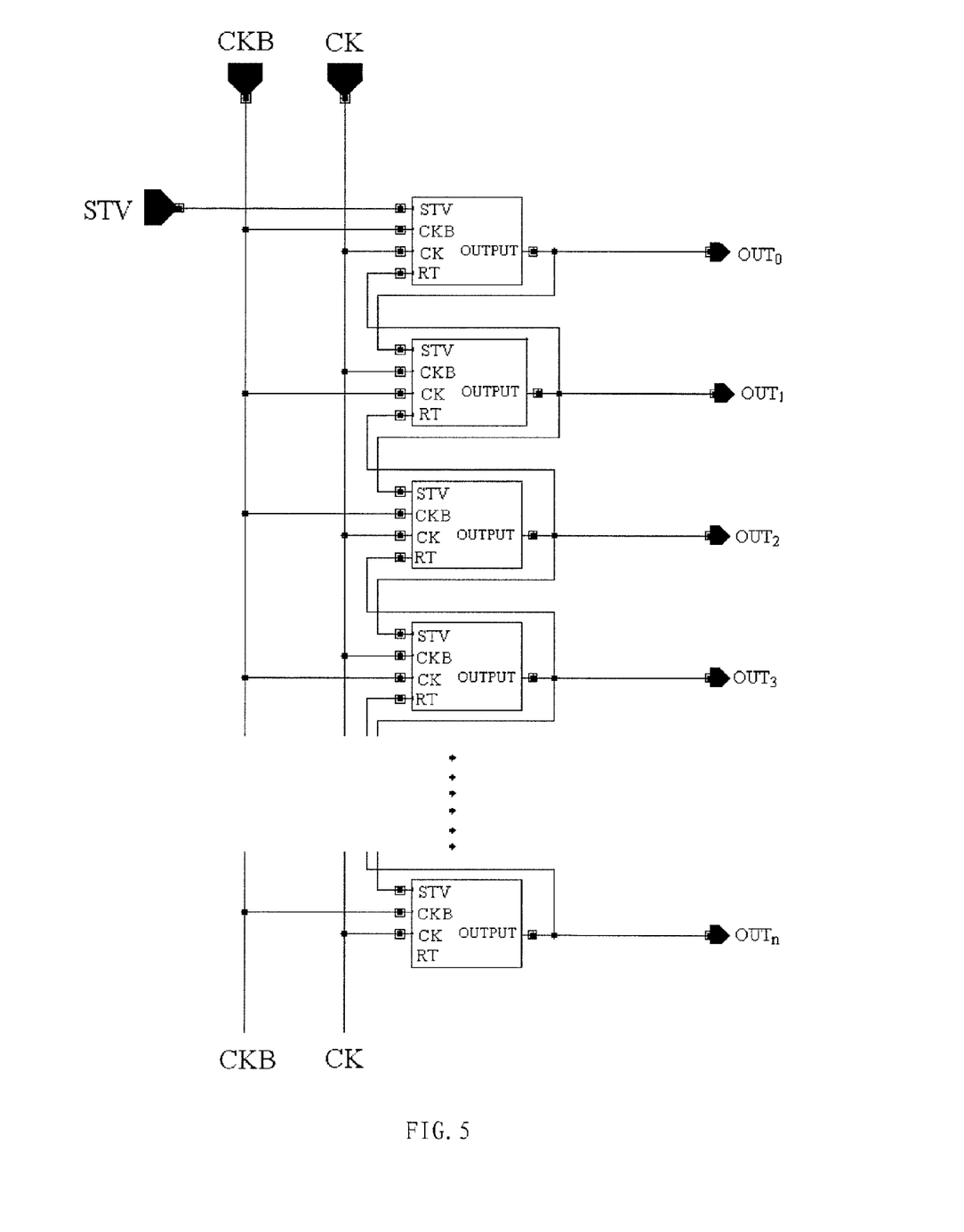
FIG. 5 is a schematic view illustrating a structure of a shift register according to the embodiment of the disclosed technical solution.

As shown in FIG. 5, the shift register comprises multiple stages of the shift register units $S_1, S_2, \ldots, S_n$, wherein respective stages of the shift register units generate their scan signals at respective output terminals ($OUT_0, OUT_1, OUT_2, \ldots OUT_n$). The shift register unit at each stage has a first clock input port CKB, a second clock input port CK, a start signal input port, a reset signal input port RT and a scan signal output port $OUT_n$. All of the shift register units at respective stages utilize the shift register unit circuits with the above-described circuit structure. Wherein, In the shift register unit $S_1$ at the first stage, the start signal STV is input to its start signal input port, the first clock signal is input to its first clock input port, the second clock signal is input to its second clock input port, and its reset signal input port is connected to the scan signal output port of the shift register unit at the next stage;

In the shift register unit $S_2$ at a stage just next to the first stage, a scan signal output from the shift register unit $S_1$ at the first stage is input to a start signal input port of the shift register unit $S_2$, the second clock signal is input to its first clock input port, the first clock signal is input to its second clock input port, and its reset signal input port is connected to the scan signal output port of the shift register unit at the next stage;

The rest can be done in the same way until the shift register unit $S_n$, and for a shift register unit $S_n$ which is connected in cascade at the last stage, no reset signal is needed to be input.

It is noted that, in the shift register unit $S_n$ where n is an odd number, the first clock signal should be input to its first clock input port and the second clock signal should be input to its second clock input port. Instead, in the shift register unit $S_n$ where n is an even number, the second clock signal should be input to its first clock input port and the first clock signal should be input to its second clock input port.

Figure 6:
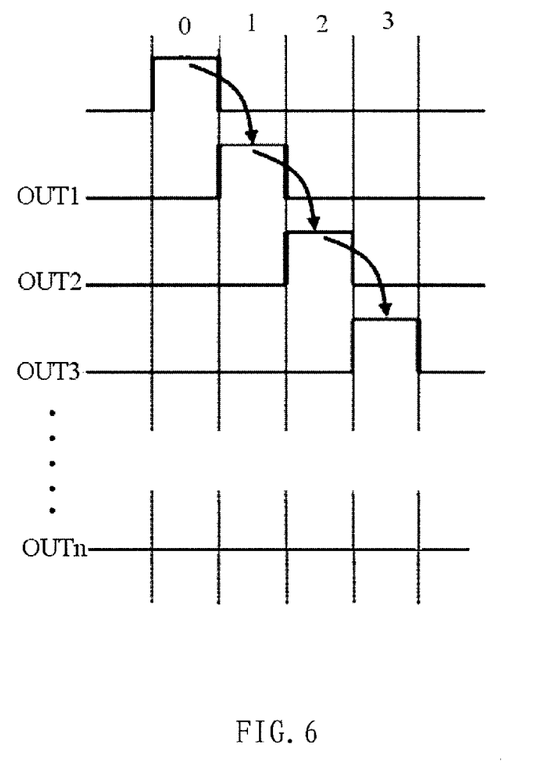
FIG. 6 is a schematic view illustrating a process for outputting gate scan signals line-by-line from top to bottom in the shift register according to the embodiment of the disclosed technical solution.

As shown in FIG. 6, the shift register operates under two clocks and outputs the gate scan signals line-by-line from top to bottom.

A liquid crystal display array substrate according to an embodiment of the disclosed technical solution has a GOA circuit disposed on it, a shift register of the GOA circuit has a structure including at least two shift register unit circuits connected in cascade (as shown in FIG. 5) and operates based on two-phase clock signal. Wherein, the shift register unit circuit comprises:

input terminals including a start signal input terminal, a first clock signal input terminal and a second clock signal input terminal;

a pre-charging circuit for outputting a turn-on level in response to an enable level of a start signal and of a first clock signal, and keeping the turn-on level being output during one clock period of the first clock signal;

a level pulling-down circuit for pulling down a level at an output terminal of the pre-charging circuit and outputting a low level in response to the enable level of the second clock signal, and for output a high level in response to a disable level of the second clock signal, after the turn-on level is input;

an outputting circuit for inverting the level output from the level pulling-down circuit and outputting it; and a scan signal output terminal, which is coupled to the output terminal of the outputting circuit, for outputting a scan signal.

In a liquid crystal display array substrate according to an embodiment of the disclosed technical solution, the level pulling-down circuit comprises a first level pulling-down circuit and a second level pulling-down circuit, wherein:

the first level pulling-down circuit pulls down the level at the output terminal of the pre-charging circuit and outputs the pulled-down low level after the turn-on level is input; and outputs the high level after the turn-on level is turned off;

the second level pulling-down circuit outputs the low level in response to the enable level of the second clock signal, and outputs the high level in response to the disable level of the second clock signal, when the first level pulling-down circuit outputs the low level; and the second level pulling-down circuit outputs the high level when the first level pulling-down circuit outputs the high level.

In a liquid crystal display array substrate according to an embodiment of the disclosed technical solution, the shift register unit circuit may further comprises a feedback circuit for feeding the scan signal output via the scan signal output terminal back to the output terminal of the level pulling-down circuit so as to stabilize the output scan signal.

The shift register unit circuit integrated on the liquid crystal display array substrate according to an embodiment of the disclosed technical solution may be the circuit having the structures as described in the above Embodiment 1 and Embodiment 2.

A liquid crystal display according to an embodiment of the disclosed technical solution comprises a liquid crystal display array substrate having the above-described structure.

The above are only exemplary embodiments of the disclosed solution, but the scope sought for protection is not limited thereto. Instead, any or all modifications or replacements as would be obvious to those skilled in the art are intended to be included within the scope of the present invention. Therefore, the scope of the present invention is defined in the appended claims.

What is claimed is:

1. A shift register unit circuit, comprising:
   input terminals including a start signal input terminal, a first clock signal input terminal and a second clock signal input terminal;
   a pre-charging circuit for outputting a turn-on level in response to an enable level of a start signal and of a first clock signal, and keeping the turn-on level being output during one clock period of the first clock signal;
   a level pulling-down circuit for pulling down a level at an output terminal of the pre-charging circuit and outputting a low level in response to an enable level of the second clock signal, and for outputting a high level in response to a disable level of the second clock signal, after the turn-on level is input; and for outputting the high level after the turn-on level is turned off;
   an outputting circuit, which is coupled to the output terminal of the level pulling-down circuit, for pulling down a level at an output terminal of the outputting circuit and outputting the low level in response to the high level output from the level pulling-down circuit, and for outputting the high level in response to the low level output from the level pulling-down circuit; and
   a scan signal output terminal, which is coupled to the output terminal of the outputting circuit, for outputting a scan signal.

2. The shift register unit circuit according to claim 1, wherein the pre-charging circuit comprises a first switch, a first node and a capacitor, wherein:
   a gate of the first switch is connected to the first clock signal, a drain thereof is connected to the start signal, and a source thereof is coupled to the first node;
   the first node is a turn-on level output terminal of the pre-charging circuit; and
   one terminal of the capacitor is coupled to the first node, and the other terminal is coupled to the low level.

3. The shift register unit circuit according to claim 1, wherein the outputting circuit comprises a sixth switch and a seventh switch, wherein:
   a gate and a drain of the sixth switch are coupled to each other, the drain thereof is connected to the high level, and a source thereof is coupled to the scan signal output terminal;

a gate of the seventh switch is coupled to the output terminal of the second level pulling-down circuit, a drain thereof is coupled to the scan signal output terminal, and a source thereof is connected to the low level.

4. The shift register unit circuit according to claim 1, wherein the level pulling-down circuit comprises a first level pulling-down circuit and a second level pulling-down circuit, wherein:
the first level pulling-down circuit pulls down the level at the output terminal of the pre-charging circuit and outputs the pulled-down low level, after the turn-on level is input; and outputs the high level after the turn-on level is turned off;
the second level pulling-down circuit outputs the low level in response to the enable level of the second clock signal, and outputs the high level in response to the disable level of the second clock signal, when the first level pulling-down circuit outputs the pulled-down low level; and the second level pulling-down circuit outputs the high level when the first level pulling-down circuit outputs the high level.

5. The shift register unit circuit according to claim 4, wherein the pre-charging circuit comprises a first switch, a first node and a capacitor, wherein:
a gate of the first switch is connected to the first clock signal, a drain thereof is connected to the start signal, and a source thereof is coupled to the first node;
the first node is a turn-on level output terminal of the pre-charging circuit; and
one terminal of the capacitor is coupled to the first node, and the other terminal is coupled to the low level.

6. The shift register unit circuit according to claim 4, wherein the outputting circuit comprises a sixth switch and a seventh switch, wherein:
a gate and a drain of the sixth switch are coupled to each other, the drain thereof is connected to the high level, and a source thereof is coupled to the scan signal output terminal;
a gate of the seventh switch is coupled to the output terminal of the second level pulling-down circuit, a drain thereof is coupled to the scan signal output terminal, and a source thereof is connected to the low level.

7. The shift register unit circuit according to claim 4, wherein the first level pulling-down circuit comprises a second switch, a second node and a third switch, wherein:
a gate and a drain of the second switch are coupled to each other, the drain thereof is connected to the high level, and a source thereof is coupled to the second node;
the second node is the output terminal of the first level pulling-down circuit;
a gate of the third switch is connected to the turn-on level output terminal of the pre-charging circuit, a drain thereof is coupled to the second node, and a source thereof is connected to the low level.

8. The shift register unit circuit according to claim 4, wherein the second level pulling-down circuit comprises a fourth switch, a third node and a fifth switch, wherein:
a gate of the fourth switch is connected to the second clock signal, a drain thereof is coupled to the output terminal of the first level pulling-down circuit, and a source thereof is coupled to the third node;
the third node is the output terminal of the second level pulling-down circuit;
a gate and a drain of the fifth switch are coupled to each other, the drain thereof is connected to the high level, and a source thereof is coupled to the third node.

9. The shift register unit circuit according to claim 1, further comprising a feedback circuit for feeding the scan signal output via the scan signal output terminal back to the output terminal of the level pulling-down circuit to stabilize the output scan signal.

10. The shift register unit circuit according to claim 9, wherein the pre-charging circuit comprises a first switch, a first node and a capacitor, wherein:
a gate of the first switch is connected to the first clock signal, a drain thereof is connected to the start signal, and a source thereof is coupled to the first node;
the first node is a turn-on level output terminal of the pre-charging circuit; and
one terminal of the capacitor is coupled to the first node, and the other terminal is coupled to the low level.

11. The shift register unit circuit according to claim 9, wherein the outputting circuit comprises a sixth switch and a seventh switch, wherein:
a gate and a drain of the sixth switch are coupled to each other, the drain thereof is connected to the high level, and a source thereof is coupled to the scan signal output terminal;
a gate of the seventh switch is coupled to the output terminal of the second level pulling-down circuit, a drain thereof is coupled to the scan signal output terminal, and a source thereof is connected to the low level.

12. The shift register unit circuit according to claim 9, wherein the feedback circuit comprises a eighth switch, a fourth node and a ninth switch, wherein:
a gate and a drain of the eighth switch are coupled to each other, the drain thereof is connected to the high level, and a source thereof is coupled to the fourth node;
the fourth node is a feedback output terminal of the feedback circuit and is coupled to the output terminal of the level pulling-down circuit;
a gate of the ninth switch is coupled to the scan signal output terminal, a drain thereof is coupled to the fourth node, and a source thereof is connected to the low level.

13. A shift register having at least two shift register unit circuits connected in cascade, wherein the shift register unit circuit comprising:
input terminals including a start signal input terminal, a first clock signal input terminal and a second clock signal input terminal;
a pre-charging circuit for outputting a turn-on level in response to an enable level of a start signal and of a first clock signal, and keeping the turn-on level being output during one clock period of the first clock signal;
a level pulling-down circuit for pulling down a level at an output terminal of the pre-charging circuit and outputting a low level in response to the enable level of the second clock signal, and for output a high level in response to a disable level of the second clock signal, after the turn-on level is input; and for outputting the high level after the turn-on level is turned off;
an outputting circuit, which is coupled to the output terminal of the level pulling-down circuit, for pulling down a level at an output terminal of the outputting circuit and outputting the low level in response to the high level output from the level pulling-down circuit, and for outputting the high level in response to the low level output from the level pulling-down circuit; and
a scan signal output terminal, which is coupled to the output terminal of the outputting circuit, for outputting a scan signal.

14. The shift register according to claim 13, wherein the pre-charging circuit comprises a first switch, a first node and a capacitor, wherein:
- a gate of the first switch is connected to the first clock signal, a drain thereof is connected to the start signal, and a source thereof is coupled to the first node;
- the first node is a turn-on level output terminal of the pre-charging circuit; and
- one terminal of the capacitor is coupled to the first node, and the other terminal is coupled to the low level.

15. The shift register according to claim 13, wherein the outputting circuit comprises a sixth switch and a seventh switch, wherein:
- a gate and a drain of the sixth switch are coupled to each other, the drain thereof is connected to the high level, and a source thereof is coupled to the scan signal output terminal;
- a gate of the seventh switch is coupled to the output terminal of the second level pulling-down circuit, a drain thereof is coupled to the scan signal output terminal, and a source thereof is connected to the low level.

16. The shift register according to claim 13, wherein the level pulling-down circuit comprises a first level pulling-down circuit and a second level pulling-down circuit, wherein:
- the first level pulling-down circuit pulls down the level at the output terminal of the pre-charging circuit and outputs the pulled-down low level after the turn-on level is input, and outputs the high level after the turn-on level is turned off;
- the second level pulling-down circuit outputs the low level in response to the enable level of the second clock signal, and outputs the high level in response to the disable level of the second clock signal, when the first level pulling-down circuit outputs the pulled-down low level; and the second level pulling-down circuit outputs the high level when the first level pulling-down circuit outputs the high level.

17. The shift register according to claim 16, wherein the first level pulling-down circuit comprises a second switch, a second node and a third switch, and the second level pulling-down circuit comprises a fourth switch, a third node and a fifth switch, wherein:
- a gate and a drain of the second switch are coupled to each other, the drain thereof is connected to the high level, and a source thereof is coupled to the second node;
- the second node is the output terminal of the first level pulling-down circuit;
- a gate of the third switch is connected to the turn-on level output terminal of the pre-charging circuit, a drain thereof is coupled to the second node, and a source thereof is connected to the low level;
- a gate of the fourth switch is connected to the second clock signal, a drain thereof is coupled to the output terminal of the first level pulling-down circuit, and a source thereof is coupled to the third node;
- the third node is the output terminal of the second level pulling-down circuit;
- a gate and a drain of the fifth switch are coupled to each other, the drain thereof is connected to the high level, and a source thereof is coupled to the third node.

18. The shift register according to claim 13, further comprising a feedback circuit for feeding the scan signal output via the scan signal output terminal back to the output terminal of the level pulling-down circuit to stabilize the output scan signal.

19. The shift register according to claim 18, wherein the feedback circuit comprises a eighth switch, a fourth node and a ninth switch, wherein:
- a gate and a drain of the eighth switch are coupled to each other, the drain thereof is connected to the high level, and a source thereof is coupled to the fourth node;
- the fourth node is a feedback output terminal of the feedback circuit and is coupled to the output terminal of the level pulling-down circuit;
- a gate of the ninth switch is coupled to the scan signal output terminal, a drain thereof is coupled to the fourth node, and a source thereof is connected to the low level.

20. A liquid crystal display including a liquid crystal display array substrate having a GOA circuit disposed thereon, a shift register in the GOA circuit including at least two shift register unit circuits connected in cascade, the shift register unit circuit comprising:
- input terminals including a start signal input terminal, a first clock signal input terminal and a second clock signal input terminal;
- a pre-charging circuit for outputting a turn-on level in response to an enable level of a start signal and of a first clock signal, and keeping the turn-on level being output during one clock period of the first clock signal;
- a level pulling-down circuit for pulling down a level at an output terminal of the pre-charging circuit and outputting a low level in response to the enable level of the second clock signal, and for output a high level in response to a disable level of the second clock signal, after the turn-on level is input; and for outputting the high level after the turn-on level is turned off;
- an outputting circuit, which is coupled to the output terminal of the level pulling-down circuit, for pulling down a level at an output terminal of the outputting circuit and outputting the low level in response to the high level output from the level pulling-down circuit, and for outputting the high level in response to the low level output from the level pulling-down circuit; and
- a scan signal output terminal, which is coupled to the output terminal of the outputting circuit, for outputting a scan signal.

* * * * *